United States Patent [19]
Kasai et al.

[11] Patent Number: 5,361,970
[45] Date of Patent: Nov. 8, 1994

[54] METHOD OF PRODUCING A SEMICONDUCTOR INTEGRATED CIRCUIT DEVICE HAVING TERMINAL MEMBERS PROVIDED BETWEEN SEMICONDUCTOR ELEMENT AND LEADS

[75] Inventors: Junichi Kasai; Michio Sono; Tosiyuki Honda, all of Kawasaki, Japan

[73] Assignee: Fujitsu Limited, Kawasaki, Japan

[21] Appl. No.: 187,733

[22] Filed: Jan. 28, 1994

Related U.S. Application Data

[62] Division of Ser. No. 889,954, May 29, 1992, Pat. No. 5,309,016.

[30] Foreign Application Priority Data

May 30, 1991 [JP] Japan .................................. 3-127908

[51] Int. Cl.$^5$ ........................................... H01L 21/603
[52] U.S. Cl. ............................................... 228/180.5
[58] Field of Search ........................ 228/180.5, 4.5; 257/676

[56] References Cited

U.S. PATENT DOCUMENTS

| | | | |
|---|---|---|---|
| 4,306,915 | 12/1981 | Shiba | 257/346 |
| 4,612,564 | 9/1986 | Moyer | 257/676 |
| 4,714,952 | 12/1987 | Takekawa et al. | 257/676 |
| 4,903,114 | 2/1990 | Aoki et al. | 257/666 |
| 5,123,585 | 6/1992 | Terakado et al. | 228/180.5 |
| 5,297,722 | 3/1994 | Takahashi et al. | 228/180.5 |

FOREIGN PATENT DOCUMENTS 60-234335 11/1985 Japan .

*Primary Examiner*—Kenneth J. Ramsey
*Attorney, Agent, or Firm*—Staas & Halsey

[57] ABSTRACT

A semiconductor integrated circuit device includes a semiconductor element having pads, a lead frame stage on which the semiconductor element is mounted, and a plurality of terminal members mounted on the lead frame stage and located outside the semiconductor element, the terminal members respectively having electrically conductive patterns and being made of a material identical to a material of which the semiconductor element is made. The device includes inner leads spaced part from the lead frame stage, a first group of bonding members connecting the pads of the semiconductor element and the electrically conductive patterns of the terminal members to each other, and a second group of bonding members connecting the electrically conductive patterns of the terminal members and the inner leads to each other.

14 Claims, 4 Drawing Sheets

METHOD OF PRODUCING A SEMICONDUCTOR INTEGRATED CIRCUIT DEVICE HAVING TERMINAL MEMBERS PROVIDED BETWEEN SEMICONDUCTOR ELEMENT AND LEADS

This application is a division of application Ser. No. 07/889,954, filed on May 29, 1992, now U.S. Pat. No. 5,309,016.

BACKGROUND OF THE INVENTION

1. Field of the Invention

The present invention generally relates to semiconductor integrated circuit devices, and more particularly to a semiconductor integrated circuit device having terminal members which function as relay members for connecting a semiconductor element and leads to each other.

2. Description of the Prior Art

Recently, there have been requirements to provide semiconductor integrated circuit devices having an increased integration density and an increased number of external pins. In order to meet the above requirement, a semiconductor device has been proposed in which a small-sized semiconductor element is mounted on a semiconductor device having a large number of pins. In such a semiconductor device, it is required that the ends of inner leads be positioned close to pads of the semiconductor element so that wire bonding can be carried out. As the number of terminals increases, the distance between adjacent inner leads decreases. In the currently available lead frame production technology, it becomes very difficult to position the ends of the inner leads so that they are close to the semiconductor element in a state where the inner leads have enough mechanical strength to withstand against the wire bonding.

In order to fabricate the above-mentioned semiconductor device with the current wire bonding technology, there has been proposed use of terminal members (relay members on which electrically conductive patterns are formed in order to connect pats formed on the semiconductor element and the inner leads (see Japanese Laid-Open Patent Publication No. 60-234335). The ends of the inner leads and opposing ends of the conductive patterns are connected to each by wire bonding, and pads of the semiconductor element and other ends of the conductive patterns are connected to each other by wire bonding. The terminal members are formed on a lead frame stage. During a step of forming the lead frame stage, the terminal members are integrally formed with the lead frame stage so that the terminal members are located outside a mounting position of the semiconductor element on the lead frame stage. Then, the electrically conductive patterns are formed on upper surfaces of the electrically conductive patterns by an etching or the like.

However, the semiconductor device disclosed in Japanese Laid-Open Patent Publication No. 60-234335 has the following disadvantages. It is troublesome to form the lead frame stage because the terminal members are integrally formed with the lead frame stage. Further, a complex process is needed to form the conductive patterns on the terminal members integrated with the lead frame stage. As a result, it is very difficult to efficiently produce the semiconductor devices.

Japanese Laid-Open Patent Publication No. 60-234335 does not show what material is suitable for the terminal members. However, it is very important to select a proper material for making the terminal members. If the terminal members are made of a soft material, such as glass epoxy, a failure in bonding will take place. Normally, an ultrasonic bonding process is used for wire bonding. During the bonding process, such soft terminal members are vibrated while they are maintained at a high temperature.

SUMMARY OF THE INVENTION

It is a general object of the present invention to provide a semiconductor integrated circuit device in which the above disadvantages are eliminated.

A more specific object of the present invention is to provide a semiconductor integrated circuit device The above objects of the present invention are achieved by a semiconductor integrated circuit device comprising: a semiconductor element having pads; a lead frame stage on which the semiconductor element is mounted; a plurality of terminal members mounted on the lead frame stage and located outside the semiconductor element, the terminal members respectively having electrically conductive patterns and being made of a material identical to a material of which the semiconductor element is made; inner leads spaced apart from the lead frame stage; a first group of bonding members connecting the pads of the semiconductor element and the electrically conductive patterns of the terminal members to each other; and a second group of bonding members connecting the electrically conductive patterns of the terminal members and the inner leads to each other.

Another object of the present invention is to provide a method of producing the above semiconductor integrated circuit device.

This object of the present invention is achieved by a method of producing a semiconductor integrated circuit device, the method comprising the steps of: bonding, by a first bonder having a first bonding precision, inner leads and electrically conductive patterns formed on terminal members formed on a lead frame stage on which a semiconductor element is formed; and bonding, by a second bonder having a second bonding precision, the electrically conductive patterns and pads formed on the semiconductor element

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
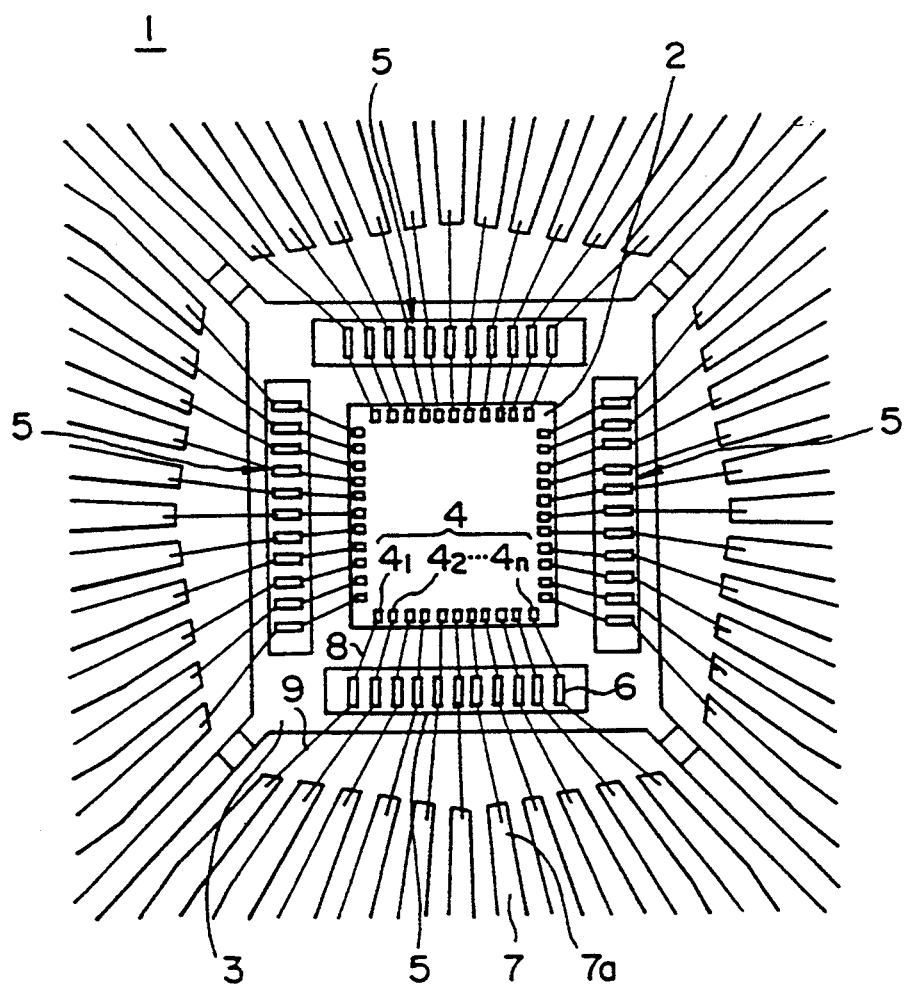
FIG. 1 is a plan view of a first embodiment of the present invention.
Figure 2:
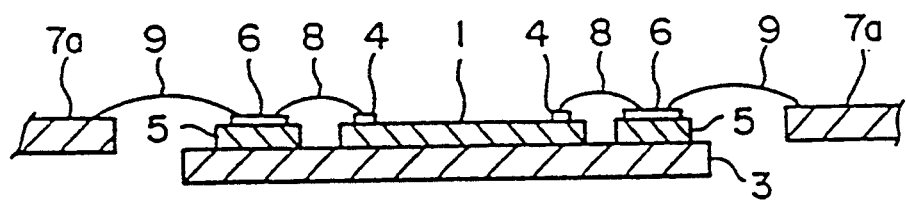
FIG. 2 is a is a cross-sectional view of the first embodiment of the present invention.

A description will now be given of a first embodiment of the present invention with reference to FIGS. 1 and 2. A semiconductor device 1 shown in FIGS. 1 and 2 comprises a semiconductor element 2, which is mounted on a lead frame stage 3. The semiconductor element 2 has, for example, 196–256 terminals. A plurality of pads 4 ($4_1 \ldots, 4_n$) corresponding to the terminals of the semiconductor element 2 are arranged in a line along the edges of peripheral portions of the semiconductor element 2 having an approximately square shape. The lead frame stage 3 is made of an Fe—Ni alloy or a Cu alloy, and functions as a base of the semiconductor device 1.

On the lead frame stage 3, provided are four terminal members 5 so that they surround the four sides Of the semiconductor element 2. Each of the four terminal members 5 has an approximately rectangular shape. As will be described later, the terminal members 5 have significant heat-resistance and mechanical strength. The terminal members 5 are made of a material identical to that of the semiconductor element 2. For example, the semiconductor element 2 and the terminal members 5 are made of silicon (Si). The plurality of pads 4 ($4_1, 4_2, \ldots, 4_n$) are formed on the surface of the semiconductor element 2, and a plurality of electrically conductive patterns 6 ($6_1, 6_2, \ldots, 6_n$) are formed on the respective terminal members 5. For example, the number of pads 4 is equal to the number of conductive patterns 6.

Inner leads 7, which are equal in number to the pads 4 of the semiconductor element 2, are provided to make an external connection. As shown in FIG. 1, the inner leads 7 are radially arranged so that they surround the lead frame stage 3 on which the semiconductor element 2 and the terminal members 5 are mounted. Ends 7a of the inner leads 7 are formed so to be as small as possible and as thin as possible within dimensions which can withstand wire bonding. For example, the ends 7a of the inner leads 7 have a width of 0.1 mm and a thickness of 0.1 mm. The opposing side surfaces of adjacent inner leads 7 are spaced apart from each other at intervals equal to 0.1 mm.

In order to directly connect the pads 4 and the inner leads 7 to each other, it is necessary to make the ends 7a of the inner leads 7 narrower and thinner. However, such ends of the inner leads 7 may withstand wire bonding. As has been mentioned previously, ultrasonic bonding is used to perform the wire bonding. The diminished ends of the inner leads 7 have sufficient mechanical strength, but are vibrated due to a vibration of the ultrasonic wave. The vibration of the ends of the inner leads 7a prevents the wire bonding. Due to the above, there is a limit to the dimensions of the ends of the inner leads 7. There is also a limit to the intervals between the adjacent inner leads. In actuality, the intervals between each of the adjacent inner leads is limited to 0.2 mm.

When an increased number of pads on the semiconductor element 2 is required and hence the ends 7a of the inner leads 7 and the pads 4 cannot be directly connected to each other, the terminal members 5, on which the conductive patterns 6 are formed, are provided between the pads 4 and the ends 7a of the inner leads 7. The conductive patterns 6 are formed on the terminal members 5, which have a high rigidity. Hence, the conductive patterns 6 are not vibrated during the wire-bonding process even if they each have a small width and a small thickness.

Inside wires 8 are wire-bonded between the pads and the conductive patterns 6, and outside wires 9 are wire-bonded between the conductive patterns 6 and the ends 7a of the inner leads 7. The inside wires 8 and the outside wires 9 have a diameter of between, for example, $25\mu\phi$–$30\mu\phi$. Since the terminal members 5 are arranged so that they surround the four sides of the semiconductor element 2, the semiconductor element 2 directly mounted on the lead frame stage 3, and the height of the pads 4 is almost the same as that of the conductive patterns 6. Hence, the operability of wire-bonding can be improved.

Figure 3A:
FIGS. 3A and 3B are front and side views of terminal members used in the first embodiment of the present invention shown in FIGS. 1 and 2.
Figure 3B:
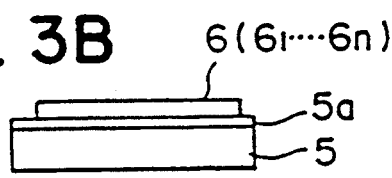

A description will now be given of the terminal members 5 with reference to FIGS. 3A and 3B, which show one of the terminal members 5. The terminal members 5 are formed separately from the lead frame stage 3, and mounted on the lead frame stage 3 during the production process of the semiconductor device 1. The terminal members 5 are made of a material which is the same as the semiconductor element 2. For example the terminal members 5 and the semiconductor element 2 are made of silicon. An insulating layer is formed on the upper surface of each of the terminal members 5. For example, an $SiO_2$ layer is formed by a thermal oxidation process, or a glass layer is formed by a CVD process. The conductive patterns 6 ($6_1, \ldots, 6_n$), made of, for example, Al or Au, are formed on the insulating layer 5a of each of the terminal members 5. The conductive patterns 6 are made of a metallic material suitable for wire bonding, such as Al or Au. The terminal members 5 have a simple structure and can be independently handled as chip parts. Hence, the terminal members 5 are suitable for mass production.

The above-mentioned terminal members 5 mounted on the lead frame stage 3 have identical shapes, and the number thereof is identical to the number of conductive patterns 6. However, it is possible to design the semiconductor device 1 so that the terminal members 5 have different shapes and the number thereof is different from the number of conductive patterns 6. It is also possible to provide the terminal members 5 along less than four sides of the semiconductor element 2. For example, it is possible to provide three terminal members along three sides of the semiconductor element 2. Further, the lead frame stage 3 can be used for semiconductor elements having different shapes or dimensions.

The semiconductor element 2 and the terminal members 5 are fastened to the lead frame stage 3 by die bonding. During the die-bonding process, silver paste is coated on the lead frame stage 3 at room temperature. Next, the semiconductor element 2 and the terminal members 5 are placed on the lead frame stage 3 on which silver paste has been coated. Then, the curing process is carried out at a temperature of 150 so that the semiconductor element 2 and the terminal members 5 are fastened to the lead frame stage 3.

The semiconductor element 2 and the terminal members 5 are made of silicon and thus stress due to the heating during the die-bonding process occurs in the semiconductor element 2 in the same manner as stress occurs in the terminal members 5. Hence, there is no possibility that cracks will occur in only the terminal members 5. That is, the semiconductor element 2 and the terminal members 5 are die-bonded to the lead frame stage 3 under the same condition.

Figure 4:
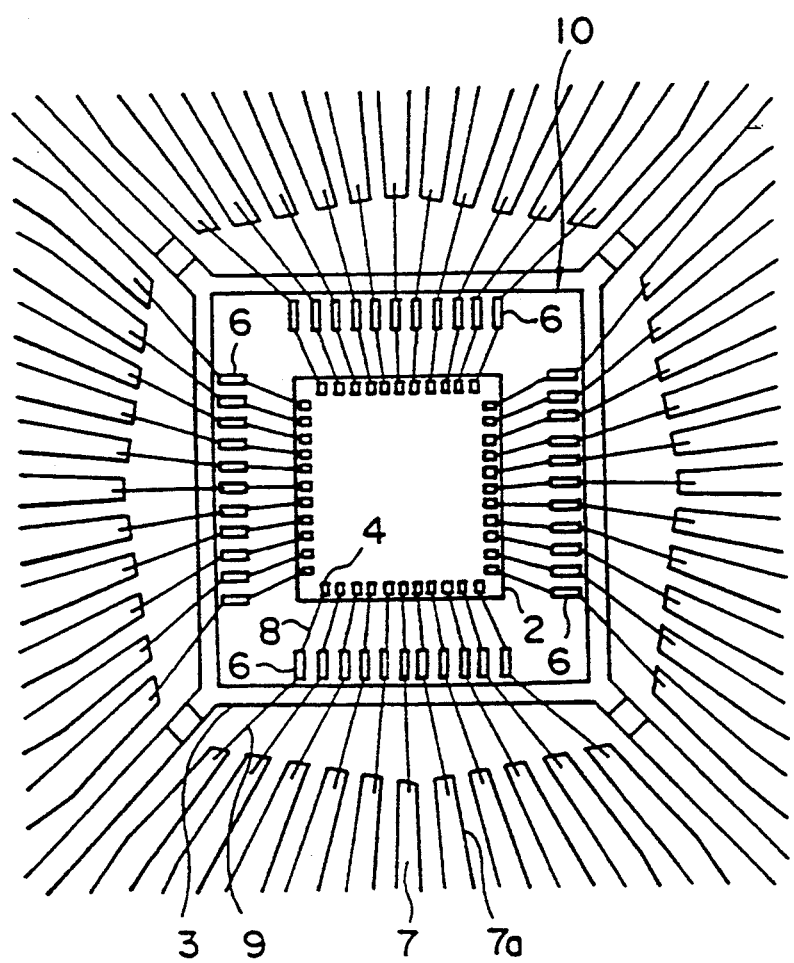
FIG. 4 is a plan view of a second embodiment of the present invention.
Figure 5:
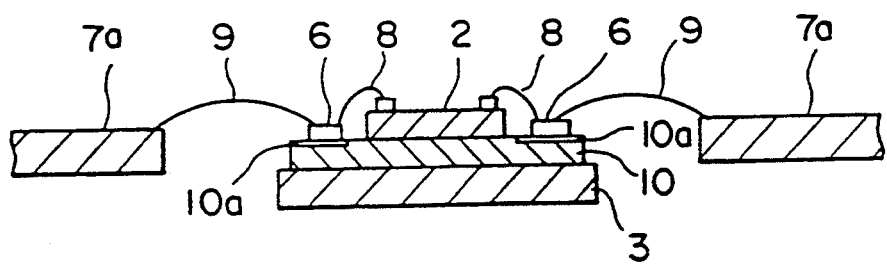
FIG. 5 is a cross-sectional view of the second embodiment of the present invention.
Figure 6:
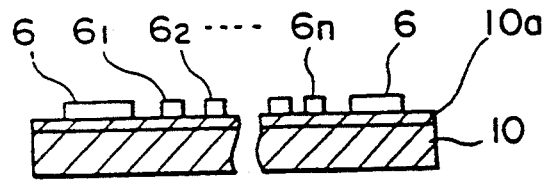
FIG. 6 is a cross-sectional view of a terminal member used in the second embodiment of the present invention shown in FIGS. 4 and 5.

FIGS. 4 through 6 show a second embodiment of the present invention. In FIGS. 4 through 6, those parts which are the same as those shown in the previous figures are given the same reference numerals. The four terminal members 5 used in the first embodiment of the present invention are integrally formed with each other, so that a single plate-shaped terminal member 10 is fixed on the upper surface of the lead frame stage 3 by die bonding. On the terminal member 10, are mounted the semiconductor element 2 and the conductive patterns 6. As shown in FIGS. 4 and 5, the conductive patterns, which are formed on an insulating layer 10a formed on the terminal member 10, are arranged in a line along the four sides of the terminal member 10. As shown in FIG. 5, the insulating layer 10a can be formed on a part of the surface of the terminal member 10. Alternatively, it is possible to form the insulating layer on entire surface of the terminal member 10. The inside wires 8 are bonded so that the pads 4 of the semiconductor element 2 and the conductive patterns 6 are connected to each other. The outside wires 9 are bonded so that the conductive patterns 6 and the ends 7a of the inner leads 7 are connected to each other.

The terminal member 10 is made of a material the same as that of the semiconductor element 2. For example, the terminal member 10 and the semiconductor elements 2 are made of silicon. The conductive patterns 6 ($6_1$-$6_n$ equal in number to the pads 4 of the semiconductor element 2 are formed on the terminal member 10. Hence, a smaller number of parts is used in the second embodiment of the present invention, as compared with the first embodiment of the present invention. As a result the production process can be facilitated. Particularly, the terminal member positioning step and the die-bonding step can be simplified.

It is also possible to use TAB (Tape Automated Bonding) in lieu of the wire bonding.

It will be noted that a load of bonding according to the present invention is greater than that in prior art in which the inner leads are directly bonded to the pads formed on the semiconductor element. However, the load of bonding according to the present invention does not increase greatly. In order to perform wire bonding of the present invention, two bonders are used. The first bonder is used for wire bonding between the inner leads 7 and the electrically conductive patterns 6, and the second bonder is used for wire bonding between the electrically conductive patterns 6 and the pads on the semiconductor element 2. The second bonder must have a high bonding precision, while the first bonder is not required to nave a bonding precision as high as the second bonder. The first bonder is less expensive. At the first stage of the wire-bonding process, the inner leads 7 and the conductive patterns 6 are bonded by the wires 9 by using the first bonder. After the first stage of the wire-bonding process is completed, the second stage is carried out in which the conductive patterns 6 and the pads 4 are bonded by the wires 8 by using the second bonder. In this manner, it becomes possible to complete the wire bonding at a time less than twice the time necessary for wire bonding in the prior art.

The present invention is not limited to the specifically disclosed embodiments, and variations and modifications may be made without departing from the scope of the present invention.

What is claimed is:

1. A method of producing a semiconductor integrated circuit device, said method comprising the steps of:
    (a) bonding, by a first bonder having a first bonding precision, inner leads and electrically conductive patterns formed on terminal members formed on a lead frame stage on which a semiconductor element is formed; and
    (b) bonding, by a second bonder having a second bonding precision different from said first precision, said electrically conductive patterns and pads formed on said semiconductor element.

2. A method of producing a semiconductor integrated circuit device as claimed in claim 1, wherein the second bonding precision is greater than the first bonding precision.

3. A method of producing a semiconductor integrated circuit device as claimed in claim 1, wherein step (a) is performed before step (b).

4. A method of producing a semiconductor integrated circuit device as claimed in claim 1, wherein the terminal members and the semiconductor element are formed of the same material.

5. A method of producing a semiconductor integrated circuit device as claimed in claim 1, wherein the semiconductor element and terminal members are formed on the lead frame stage by die bonding.

6. A method of producing a semiconductor integrated circuit device as claimed in claim 5, wherein the semiconductor element and the terminal members are bonded to the lead frame stage by the substeps comprising:
    coating silver paste to the lead frame stage;
    placing the semiconductor element and terminal members on the lead frame stage on which the silver paste has been applied; and
    curing the semiconductor element and terminal members placed on lead frame stage.

7. A method of producing a semiconductor integrated circuit device, comprising the steps of:
    (a) forming a terminal member on a lead frame stage;
    (b) forming an insulating layer on a portion of the terminal member;
    (c) forming electrically conductive patterns on the insulating layer;
    (d) forming a semiconductor element on the terminal member;
    (e) forming pads on the semiconductor element;
    (f) bonding, by a first bonder having a first bonding precision, the inner leads and the electrically conductive patterns; and
    (g) bonding, by a second bonder having a second bonding precision different from said first precision, the electrically conductive patterns and the pads.

8. A method of producing a semiconductor integrated circuit device as claimed in claim 7, wherein the second bonding precision is greater than the first bonding precision.

9. A method of producing a semiconductor integrated circuit device as claimed in claim 7, wherein step (f) is performed before step (g).

10. A method of producing a semiconductor integrated circuit device as claimed in claim 7, wherein the terminal members and the semiconductor element are formed of the same material.

11. A method of producing a semiconductor integrated circuit device, comprising the steps of:

(a) forming a terminal member on a lead frame stage;

(b) forming an insulating layer on the terminal member;

(c) forming electrically conductive patterns and a semiconductor element on the insulating layer;

(d) forming pads on the semiconductor element;

(e) bonding, by a first bonder having a first bonding precision different from said first precision, the inner leads and the electrically conductive patterns; and (f) bonding, by a second bonder having a second bonding precision, the electrically conductive patterns and the pads.

12. A method of producing a semiconductor integrated circuit device as claimed in claim 11, wherein the second bonding precision is greater than the first bonding precision.

13. A method of producing a semiconductor integrated circuit device as claimed in claim 11, wherein step (e) is performed before step (f).

14. A method of producing a semiconductor integrated circuit device as claimed in claim 11, wherein the terminal members and the semiconductor element are formed of the same material,

* * * * *

UNITED STATES PATENT AND TRADEMARK OFFICE
CERTIFICATE OF CORRECTION

PATENT NO. : 5,361,970
DATED : November 8, 1994
INVENTOR(S) : Junichi KASAI et al.

It is certified that error appears in the above-indentified patent and that said Letters Patent is hereby corrected as shown below:

Col. 3, line 10, after "$4_1$" insert --,--;
      line 18, change "Of" to --of--; and
      line 39, after "so" insert --as--.

Col. 4, line 10, after "2" (second occurrence) insert --is--.

Col. 5, line 45, after "two" insert --die--; and
      line 52, change "nave" to --have--.

Signed and Sealed this

Seventh Day of March, 1995

Attest:

BRUCE LEHMAN

Attesting Officer      Commissioner of Patents and Trademarks